(12) United States Patent
Thekkethil

(10) Patent No.: US 8,091,140 B2
(45) Date of Patent: *Jan. 3, 2012

(54) ELECTRO-MECHANICAL SYSTEM FOR NON-DUPLICATION OF AUDIO FILES

(75) Inventor: George John Thekkethil, Bangalore (IN)

(73) Assignee: Trinity Future-IN PVT. Ltd., Bangalore (IN)

( * ) Notice: Subject to any disclaimer, the term of this patent is extended or adjusted under 35 U.S.C. 154(b) by 1016 days.

This patent is subject to a terminal disclaimer.

(21) Appl. No.: 11/996,525

(22) PCT Filed: Apr. 12, 2006

(86) PCT No.: PCT/IN2006/000120
§ 371 (c)(1),
(2), (4) Date: Jan. 23, 2008

(87) PCT Pub. No.: WO2007/013090
PCT Pub. Date: Jan. 2, 2007

(65) Prior Publication Data
US 2008/0204918 A1  Aug. 28, 2008

(30) Foreign Application Priority Data
Jul. 25, 2005  (IN) .................. IN999/CHE/2005

(51) Int. Cl.
*G06F 21/22* (2006.01)
*G06F 12/14* (2006.01)

(52) U.S. Cl. ............... 726/27; 726/28; 726/31; 726/33; 705/51; 705/52; 705/57; 713/153; 713/164; 713/192; 713/193

(58) Field of Classification Search ............ 726/27, 726/31, 33
See application file for complete search history.

(56) References Cited

U.S. PATENT DOCUMENTS

| 5,574,787 A * | 11/1996 | Ryan .................... 380/201 |
| 5,896,454 A | 4/1999 | Cookson et al. |
| 6,844,214 B1 * | 1/2005 | Mei et al. ............... 438/52 |
| 7,814,554 B1 * | 10/2010 | Ragner .................. 726/27 |
| 2005/0063674 A1 | 3/2005 | Bilinski et al. |
| 2005/0081064 A1 | 4/2005 | Ooi et al. |
| 2005/0089164 A1 | 4/2005 | Lang et al. |

FOREIGN PATENT DOCUMENTS

| EP | 0 913 975 A2 | 5/1999 |
| JP | 2000/156036 A | 6/2000 |
| WO | WO 2004/109688 A1 | 12/2004 |

* cited by examiner

*Primary Examiner* — Jeffrey D Popham
*Assistant Examiner* — Alexander Lagor
(74) *Attorney, Agent, or Firm* — Joseph T. Leone, Esq.; Daniel A. Blasiole; DeWitt Ross & Stevens, S.C.

(57) ABSTRACT

A system consisting of a memory storage unit in which the licensed audio files are stored. The function of this device is to recognize the requested data and thereby allow the audio file contents from the memory storage unit according to the instructions set to this device. It is an effective means for protecting the audio files in the device from duplication.

16 Claims, 1 Drawing Sheet

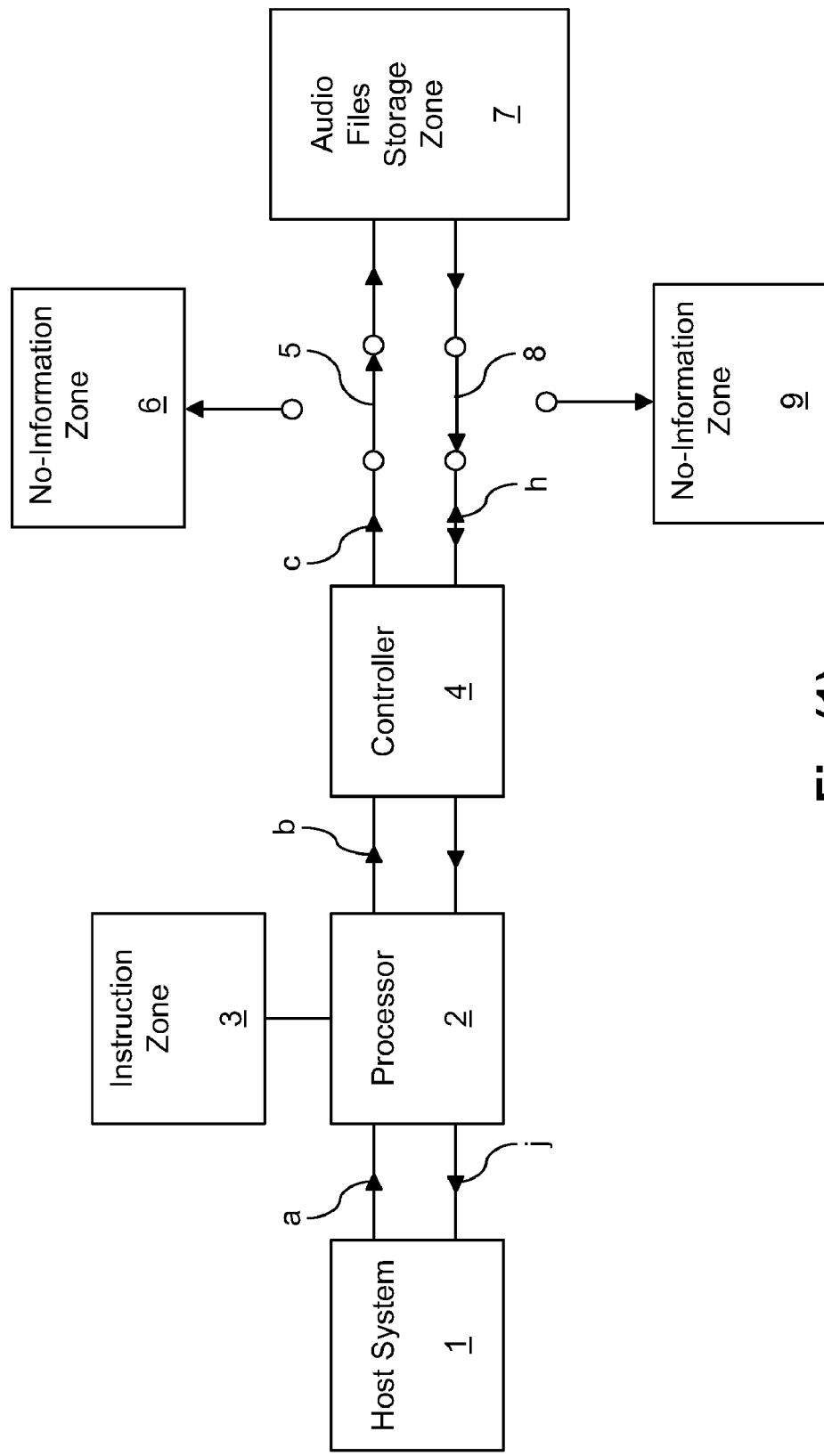
Fig (1)

ELECTRO-MECHANICAL SYSTEM FOR NON-DUPLICATION OF AUDIO FILES

FIELD OF THE INVENTION

The present invention generally relates to an electronic system for non-duplication of audio files. More particularly the present invention provides an electromechanical system for the playing of an audio file in any electronic media without the need for a CD.

The present invention provides a MEMS (Micro Electro Mechanical System) based chip useful for Non-Duplication of audio files to be played on any electronic media.

BACKGROUND ART

The biggest legal problem affecting the audio industries today is unauthorized duplication, which is the illegal copying or use of Audio files. Unauthorized duplication is a huge problem mainly because it is so easy to do. In most cases, it is no more difficult to steal a song than it is to tape on a Audio device that you have borrowed from a friend. Audio pirates get to use a specific Audio file without paying for it. Unauthorized audio duplication is the illegal reproduction and distribution of Audio files, whether for business or personal use. The audio industry has to pay a heavy price because of unauthorized Audio duplication. Unauthorized Audio duplication is thriving because of the amount of avenues it opens in business for pirates.

Reference may be made to the US Publication No. 2005/0081064 A1—to Ooi, Chin Shyan, et al, wherein it has been disclosed that:—An authentication system to verify a password it includes a first storage unit to store an authentication sequence and a read-only memory unit on which an authentication algorithm is programmed. A micro controller is coupled to the first storage unit, the read-only memory unit and a web server. The micro controller receives the password and executes the authentication algorithm to verify the password with the authentication sequence. A second storage unit is coupled to the micro controller to store data from the web server. Access to a second storage unit is permitted by the micro controller only if the password has been verified.

Reference may also be made to the US Publication No. 2005/0089164 A1—to Lang, Juergen K; et al, wherein it has been disclosed that: —The invention relates to a system and to a method for cost-effectively creating and distributing copy-protected and utilization-protected electronic audio and their data contents, whereby the data contents of the electronic media are encrypted in such a way that they cannot be completely played or displayed without the execution of cryptographic processes at the recipient who is authorized within a certain scope of utilization and in such a way that, if the electronic media are transferred to third parties, complete playback is not possible at all or else not without once again carrying out appropriate cryptographic processes. According to the invention, this objective is achieved in that a cryptographic module at the recipient is used that decrypts or deciphers completely or partially encrypted or enciphered data contents of electronic audio media or keys for decrypting or deciphering these data contents and subsequently forwards them, again in an encrypted or enciphered form, to a playback unit in such a way that the audio information can be played in the playback unit without the electronic data contents being present in unencrypted form along the transmission route, at the input or at the output of the cryptographic module or at the input of the playback unit.

Here we can see that this is a device which can be used to check unauthorized audio duplication on the web Sever using password enabled micro controller and storage units.

Here we can see that in this invention, data is copy protected by using cryptographic processes so that it cannot be copied in any way and this decoder is given only to the licensed holder of the unit to stop unauthorized audio duplication.

OBJECT OF THE INVENTION

It is thus the main object of the present invention is to provide an electromechanical system for Non-Duplication of Audio files, which obviates the drawbacks of the prior art.

Another object of the present invention is to provide an electromechanical system for Non-Duplication of Audio files useful for preventing copying of files to any electronic media.

Still another object of the present invention is to provide an electromechanical system for Non-Duplication of Audio files useful for preventing unlicensed copying of audio files to any electronic media.

A still further object of the present invention is to provide a MEMS based chip for Non-Duplication of audio files.

An object of the present invention is to provide an electronic system for Playing of audio files A still further object of the present invention is to provide an electromechanical system for Playing of audio files.

A still further object of the present invention is to provide MEMS based chip for Playing of audio files.

SUMMARY OF THE INVENTION

The present invention prevents copying of audio files to any other media storage. The electro-mechanical system can be miniaturized to a MEMS configuration. This electromechanical system integrated into a MEMS chip, which can be easily played on any electronic devices. This electromechanical system can replace the CDs and other existing audio storage devices.

Thus according to the basic aspects of the present invention provides an electromechanical system for non-duplication of audio files comprises of:

a processor receiving the request data from the host system and compares the instructions from the instruction zone and processes the requesting data accordingly;

the processed data is sent to the controller and thereby send the processed data through the switch;

if the requested data is to duplicate the audio file present in the audio files storage zone; then the switch switches to the non-information zone;

if the requested data is correct or non-duplicable of the audio file/files present in the audio files storage zone; then the switch switches to the audio files storage zone At the non-duplicated request the audio files storage zone sends the audio file to the host system through the processor;

During transfer of the audio files to the host system, if the processor understands if another duplication request is requested to the processor then the processor sends a signal to the controller to turn OFF the switch;

The above method of the present invention is adapted for non-duplication of audio files. The device comprise of a processor, controller instruction unit, switches and the storage unit or zone, which will be integrated in a MEMS (Micro Electro Mechanical System) Chip.

Additional details of the above-described method for creating and using the electromechanical system for non-duplication of audio files are provided below:

BRIEF DESCRIPTION OF THE DRAWINGS

FIG. 1 represents the electro-mechanical system wherein (1) the host system is one in which the system can request and receive data from the audio file storage zone (7). (2) is the processor, which compares the instructions from the storage zone (3). (4) is the controller that controls the switch (5) and switch (8) by the signal (c) and signal (h). Audio files are stored in audio file storage zone (7). There is no information present in zone (6) and zone (9).

DETAILED DESCRIPTION

Accordingly the present invention provides an electro-mechanical system for non-duplication of audio files, which comprises:—a processor (2) receiving the request data (a) from the host system (1). The processor (2) compares the instructions from the instruction zone (3) and processes the requesting data (a) accordingly. The processed data (b) is sent to the controller (4). The controller (4) thereby sends the processed data through the switch (5). If the requested data (a) is to duplicate the audio file present in the audio files storage zone (7) the switch (5) switches to the no-information zone (6). If the requested data (a) is correct or non-duplicable of the audio file/files present in the audio files storage zone (7) then the switch (5) switches directly into the audio files storage zone (7). According to non-duplicated request the audio files storage zone (7) sends data back to the host system (1) through the processor (2). During the transfer of the audio file to the host system (1), if the processor (2) understands if another duplication request is requested to the processor (2) then the processor (2) sends a signal (b) to the controller (4) to turn OFF the switch (8) to a no-information zone (9) by the signal (h) from the controller (4) whereas the non-duplicated request would be allowed directly through the signal (j) into the host system from the processor (2).

In an embodiment of the present invention the known audio file may be such any licensed audio file.

In still another embodiment of the present invention the host system may be such as a computer, audio players and all electronic media players that can play audio files.

According to the invention, the electronic means functions as per the following steps:

a) The host system (1) sends a request data (a) to the processor (2).
b) The processor (2) compares the requested data with the instructions from the instruction zone (3).
c) The processed data (b) is sent to the controller (4).
d) The controller (4) thereby sends the controlled signal through the switch (5) in which the requested data passes.
e) If the requested data (a) is to duplicate the audio file present in the audio files storage zone (7) the switch (5) switches to the no-information zone (6).
f) If the requested data (a) is correct or non-duplicable of the audio file/files present in the audio files storage zone (7) then the switch (5) switches directly into the audio files storage zone (7).
g) According to non-duplicated request the audio files storage zone (7) sends data back to the host system (1) through the processor (2).
h) During the transfer of the audio file to the host system (1), if the processor (2) understands if another duplication request is requested to the processor (2) then the processor (2) sends a signal (b) to the controller (4) to turn OFF the switch (8) to a no-information zone (9) by the signal (h) from the controller (4)
i) The non-duplicated request would be allowed directly through the signal (j) into the host system from the processor (2).

Electro-mechanical system may be a processor, controller, interface, switch, audio file storage zone and the no-information zone integrated together on a device.

More preferably, Electronic system may be a processor, controller, interface, switch, audio file storage zone and the no-information zone integrated together on a device.

More preferably, the electro-mechanical system is in the form of a chip.

The following example is given by way of illustration only and should not be construed to limit the scope of the invention.

Example-1

Two audio files of mp3 format are stored in the external memory of the device. Here the computer is the host system in which the audio files are played. The computer allow only "Enter" keyboard button to access the audio mp3 files present in the external memory for playing, any other button or instructions from the keyboard generates "invalid button clicked" option on to the display thereby protecting two audio mp3 files present in the device. Hence duplication/coping of these files is negated.

Advantages of the Invention

1. The electromechanical system of the present invention prevents copying of audio file to any other storage media.
2. The system can be miniaturized to a MEMS configuration.
3. The electromechanical system integrated into a MEMS chip can be played easily on any digital media devices.
4. The electromechanical system can replace the CDs and other existing storage devices for storage of audio files.
5. The electromechanical system can be adapted to any electronic media players.

The invention claimed is:

1. A system for preventing unauthorized duplication of audio files, the system comprising:

a host audio system standing alone or operationally connected to a network of audio systems, wherein the host audio system stores user-desired audio files or is dimensioned and configured to request user-desired audio files disposed in an audio file storage zone operationally connected to the network;

an audio file storage zone operationally connected to the host audio system or the network of audio systems and on which is stored the user-desired audio files, wherein the audio file storage zone is dimensioned and configured to duplicate the user-desired audio files upon receipt of a permissible request to duplicate from the host audio system;

a processor and a controller operationally connected to each other, and operationally interposed between and connected to the host audio system and the audio file storage zone, and an instruction zone operationally connected to the processor;

a first switch operationally disposed between the controller and the audio file storage zone and between the controller and a first zone, wherein the first switch is configured to toggle between a first position wherein the controller is operationally connected to the audio file storage zone and not operationally connected to the first no-information zone, and a second position wherein the controller is operationally connected to the first no-information zone and not operationally connected to the audio file storage zone, wherein the first switch is operationally connected to the controller which is configured to toggle the first switch between the first and second positions;

a second switch operationally disposed between the controller and the audio file storage zone and between the controller and a second no-information zone, wherein the second switch is configured to toggle between a first position wherein the controller is operationally connected to the audio file storage zone and not operationally connected to the second no-information zone, and a second position wherein the controller is operationally connected to a second no-information zone and not operationally connected to the audio file storage zone, wherein the second switch is operationally connected to the controller which is configured to toggle the second switch between the first and second positions;

wherein the system is configured so that:

(a) when the host audio system sends a first request to duplicate a user-desired audio file from the audio file storage zone, the processor compares the first request from the host audio system with a database of pre-set permissible requests stored in the instruction zone, and if the first request is permissible, the controller sets the first and second switches to their first positions, thereby forming an operational connection between the host audio system and the audio file storage zone to permit transfer of data from the audio file storage zone to the host audio system, and if the request is impermissible, the controller sets the first switch to its second position, thereby connecting the host audio system to the first no-information zone, thereby preventing transfer of data from the audio file storage zone to the host audio system; and (b) when the host audio system sends a second request to duplicate the user-desired audio file from the audio file storage zone during transfer of data from the audio file storage zone to the host audio system resulting from a permissible first request, the controller sets the second switch to its second position, thereby connecting the host audio system to the second no-information zone to prevent further transfer of data from the audio file storage zone to the host audio system.

2. The system according to claim 1, wherein the host audio system is selected from the group consisting of desktop computers, laptop computers, notebook computers and personal digital assistants (PDAs).

3. The system according to claim 1, wherein the processor, the instruction zone, the controller, the first switch, and the second switch are integrated on a single computer card.

4. The system according to claim 1, wherein the processor, the instruction zone, the controller, the first switch, and the second switch are integrated into a single chip.

5. The system according to claim 1, wherein the first switch, the second switch or both the first and second switches are mechanical switches.

6. The system according to claim 1, wherein the first switch, the second switch or both the first and second switches are electronic switches.

7. The system according to claim 1, wherein the processor, the instruction zone, the controller, the first switch, and the second switch are integrated into a micro electro-mechanical system (MEMS) chip.

8. The system according to claim 1, wherein the audio file storage zone comprises a device selected from the group consisting of a memory flash, a memory flash card, a hard disk drive, random-access memory, erasable programmable read-only memory (EPROM), and electrically erasable programmable read-only memory (EEPROM).

9. A system for preventing unauthorized duplication of audio files, the system comprising:

a host audio system standing alone or operationally connected to a network of audio systems, wherein the host audio system stores user-desired audio files or is dimensioned and configured to request user-desired audio files disposed in an audio file storage zone operationally connected to the network;

an audio file storage zone operationally connected to the host audio system or the network of audio systems and on which is stored the user-desired audio files, wherein the audio file storage zone is dimensioned and configured to duplicate the user-desired audio files upon receipt of a permissible request to duplicate from the host audio system;

a processor and a controller operationally connected to each other, and operationally interposed between and connected to the host audio system and the audio file storage zone, and an instruction zone operationally connected to the processor;

a first switch operationally disposed between the controller and the audio file storage zone and between the controller and a first no-information zone, wherein the first switch is configured to toggle between a first position wherein the controller is operationally connected to the audio file storage zone and not operationally connected to the first no-information zone, and a second position wherein the controller is operationally connected to the first no-information zone and not operationally connected to the audio file storage zone, wherein the first switch is operationally connected to the controller which is configured to toggle the first switch between the first and second positions;

a second switch operationally disposed between the controller and the audio file storage zone and between the controller and a second no-information zone, wherein the second switch is configured to toggle between a first position wherein the controller is operationally connected to the audio file storage zone and not operationally connected to the second no-information zone, and a second position wherein the controller is operationally connected to a second no-information zone and not operationally connected to the audio file storage zone, wherein the second switch is operationally connected to the controller which is configured to toggle the second switch between the first and second positions;

wherein the system is configured so that:

(a) when the host audio system sends a first request to duplicate a user-desired audio file from the audio file storage zone, the processor compares the first request from the host audio system with a database of pre-set permissible requests stored in the instruction zone, and if the first request is permissible, the controller sets the first and second switches to their first positions, thereby forming an operational connection between the host audio system and the audio file storage zone to permit transfer of data from the audio file storage zone to the host audio system, and if the request is impermissible, the controller sets the first switch to its second position, thereby connecting the host audio system to the first no-information zone, thereby preventing transfer of data from the audio file storage zone to the host audio system; and (b) when the host audio system sends a second request to duplicate the user-desired audio file from the audio file storage zone during transfer of data from the audio file storage zone to the host audio system resulting from a permissible first request, the controller sets the second switch to its second position, thereby connecting the host audio system to the second no-information zone to prevent further transfer of data from the audio file storage zone to the host audio system;

and wherein the processor, the instruction zone, the controller, the first switch, and the second switch are integrated into a micro electro-mechanical system (MEMS) chip.

10. The system according to claim 9, wherein the host audio system is selected from the group consisting of desktop computers, laptop computers, notebook computers and personal digital assistants (PDAs).

11. The system according to claim 9, wherein the audio file storage zone comprises a device selected from the group consisting of a memory flash, a memory flash card, a hard disk drive, random-access memory, erasable programmable read-only memory (EPROM), and electrically erasable programmable read-only memory (EEPROM).

12. A system for preventing unauthorized duplication of audio files, the system comprising:

a host audio system standing alone or operationally connected to a network of audio systems, wherein the host audio system stores user-desired audio files or is dimensioned and configured to request user-desired audio files disposed in an audio file storage zone operationally connected to the network;

an audio file storage zone operationally connected to the host audio system or the network of audio systems and on which is stored the user-desired audio files, wherein the audio file storage zone is dimensioned and configured to duplicate the user-desired audio files upon receipt of a permissible request to duplicate from the host audio system;

a processor and a controller operationally connected to each other, and operationally interposed between and connected to the host audio system and the audio file storage zone, and an instruction zone operationally connected to the processor;

a first switch operationally disposed between the controller and the audio file storage zone and between the controller and a first no-information zone, wherein the first switch is configured to toggle between a first position wherein the controller is operationally connected to the audio file storage zone and not operationally connected to the first no-information zone, and a second position wherein the controller is operationally connected to the first no-information zone and not operationally connected to the audio file storage zone, wherein the first switch is operationally connected to the controller which is configured to toggle the first switch between the first and second positions;

a second switch operationally disposed between the controller and the audio file storage zone and between the controller and a second no-information zone, wherein the second switch is configured to toggle between a first position wherein the controller is operationally connected to the audio file storage zone and not operationally connected to the second no-information zone, and a second position wherein the controller is operationally connected to a second no-information zone and not operationally connected to the audio file storage zone, wherein the second switch is operationally connected to the controller which is configured to toggle the second switch between the first and second positions;

wherein the system is configured so that:

(a) when the host audio system sends a first request to duplicate a user-desired audio file from the audio file storage zone, the processor compares the first request from the host audio system with a database of pre-set permissible requests stored in the instruction zone, and if the first request is permissible, the controller sets the first and second switches to their first positions, thereby forming an operational connection between the host audio system and the audio file storage zone to permit transfer of data from the audio file storage zone to the host audio system, and if the request is impermissible, the controller sets the first switch to its second position, thereby connecting the host audio system to the first no-information zone, thereby preventing transfer of data from the audio file storage zone to the host audio system; and (b) when the host audio system sends a second request to duplicate the user-desired audio file from the audio file storage zone during transfer of data from the audio file storage zone to the host audio system resulting from a permissible first request, the controller sets the second switch to its second position, thereby connecting the host audio system to the second no-information zone to prevent further transfer of data from the audio file storage zone to the host audio system;

and wherein the processor, the hardware specification storage unit, the controller, the first switch, and the second switch are integrated into a single chip.

13. The system according to claim 12, wherein the host audio system is selected from the group consisting of desktop computers, laptop computers, notebook computers and personal digital assistants (PDAs).

14. The system according to claim 12, wherein the first switch, the second switch or both the first and second switches are mechanical switches.

15. The system according to claim 12, wherein the first switch, the second switch or both the first and second switches are electronic switches.

16. The system according to claim 12, wherein the audio file storage zone comprises a device selected from the group consisting of a memory flash, a memory flash card, a hard disk drive, random-access memory, erasable programmable read-only memory (EPROM), and electrically erasable programmable read-only memory (EEPROM).

* * * * *